(12) United States Patent
Ross

(10) Patent No.: US 8,850,704 B2
(45) Date of Patent: Oct. 7, 2014

(54) HEAT SINK

(75) Inventor: Ernest Ross, Encinitas, CA (US)

(73) Assignee: Sum q, Inc., Encinitas, CA (US)

( * ) Notice: Subject to any disclaimer, the term of this patent is extended or adjusted under 35 U.S.C. 154(b) by 897 days.

(21) Appl. No.: 12/699,763

(22) Filed: Feb. 3, 2010

(65) Prior Publication Data

US 2011/0185573 A1    Aug. 4, 2011

(51) Int. Cl.
| B21F 3/02 | (2006.01) |
| H01L 23/367 | (2006.01) |
| B21F 5/00 | (2006.01) |
| H01L 21/48 | (2006.01) |

(52) U.S. Cl.
CPC ............ H01L 23/3677 (2013.01); B21F 5/005 (2013.01); H01L 21/4878 (2013.01)
USPC .............. 29/890.03; 72/407; 72/412

(58) Field of Classification Search
CPC ..................... F28F 2275/12; B21F 3/02–3/10; B21F 5/005
USPC ................. 29/890.03, 890.054, 419.1, 421.2; 72/371, 137, 401, 407, 416
See application file for complete search history.

(56) References Cited

U.S. PATENT DOCUMENTS

| 1,516,430 | A | | 11/1924 | Hess |
| 2,636,523 | A | * | 4/1953 | Hammerschlag ............... 140/80 |
| 3,232,344 | A | * | 2/1966 | Andersson et al. ........... 165/156 |
| 4,302,959 | A | * | 12/1981 | Yakovlev et al. ............... 72/138 |
| 4,993,482 | A | | 2/1991 | Dolbear et al. |
| 5,195,576 | A | | 3/1993 | Hatada et al. |
| 5,365,402 | A | | 11/1994 | Hatada et al. |
| 5,375,655 | A | | 12/1994 | Lee |
| 5,673,177 | A | | 9/1997 | Brodsky et al. |
| 5,823,249 | A | | 10/1998 | Batchelder |
| 5,860,472 | A | | 1/1999 | Batchelder |
| 5,884,691 | A | | 3/1999 | Batchelder |
| 7,301,770 | B2 | | 11/2007 | Campbell et al. |
| 2002/0079097 | A1 | | 6/2002 | Lee et al. |
| 2003/0227732 | A1 | | 12/2003 | Dessiatoun et al. |

OTHER PUBLICATIONS

International Search Report and Written Opinion dated Oct. 25, 2011, International Application No. PCT/US2011/023632.

* cited by examiner

*Primary Examiner* — Christopher Besler
(74) *Attorney, Agent, or Firm* — Klein, O'Neill & Singh, LLP

(57) ABSTRACT

An improved heat sink comprises a plurality of wire fins mounted on a heat sink base. Each wire fin comprises a coil made up of a plurality of contiguous loops of wire. A wire fin can be manufactured by deforming a helical wire member to an elongate, relatively compact shape. Several such wire fins can then be mounted to a heat sink base in order to form a pin-fin type heat sink.

21 Claims, 21 Drawing Sheets

HEAT SINK

BACKGROUND OF THE INVENTION

1. Field of the Invention

The present invention is in the field of heat sinks.

2. Description of the Related Art

Heat sinks are widely used to enhance the transfer of heat between a heat source and the surrounding environment, typically a gas or a liquid. Heat sinks are used in a wide range of applications and are commonly used in electronics to remove heat from electronic components and assemblies.

Heat sinks come in many shapes and sizes. Some popular heat sink designs consist of a base and a number of fins and/or pins coformed with the base or attached to the base by brazing, soldering, bonding or some other process that provides good heat conduction between the fins and base. The heat sink is typically made from a highly thermally conductive material, usually aluminum or copper. The high thermal conductivity of the metal combined with the large surface area of the fins facilitates the transfer of thermal energy from the heat source to a surrounding fluid, which is typically air but may be other gases or liquids. In some cases, the fluid is forced through the fins such as by a fan in order to increase the rate at which heat is transferred from the heat sink to the environment.

Most heat sinks consist of one or more fins (fin type) or one or more pins (pin or pin-fin type). Pin type heat sinks typically are more effective at removing heat than are similar-sized fin type heat sinks, but fin-type heat sinks typically are simpler to fabricate, and are therefore lower in cost.

As electronic devices have increased in power and decreased in size and price, the demand for higher capacity, compact and low-cost heat sinks has also increased.

SUMMARY OF THE INVENTION

Accordingly there is a need in the art for an improved heat sink that can provide high capacity heat transfer performance in a compact package. There is also a need for such a heat sink that can be constructed in a relatively low-cost manner.

In accordance with the present invention, an improved heat sink is provided in which several pins are compactly placed so as to provide high performance in a compact package. In a preferred embodiment, several of the pins are contiguously interconnected as a single wire, or fin, and the heat sink comprises a plurality of such fins attached to a base so that the individual pins are closely spaced.

To manufacture such a heat sink according to one embodiment, an elongate helical coil is deformed in a die so as to form a fin comprising a plurality of interconnected pins, and the resulting fin is attached to a base. Several such fins are attached to the base so that the pins are closely spaced.

In accordance with one embodiment, the present invention provides a method of manufacturing a heat sink. The method comprises providing a first die body having a first wire forming region, providing a second die body opposite the first die body and having a second wire forming region, and providing an elongate third die body. The method further comprises placing an elongate coiled wire over the third die body, positioning the third die body between the first and second die bodies, and moving the first, second and third die bodies relative one another so as to compress and deform the elongate coiled wire to form a wire fin comprising a plurality of contiguous loops and having an elongate body shaped to at least partially correspond to a shape defined between the first, second and third die bodies. The wire fin has first and second ends at opposing ends of the elongate body, and each of the loops have first and second loop ends corresponding to the respective first and second ends of the wire fin. The method further includes removing the formed wire fin from between the first and second die bodies, and attaching the first end of the wire fin to a heat sink base so that the wire fin is in thermal communication with the heat sink base.

One such embodiment additionally comprises forming a plurality of wire fins and attaching the plurality of wire fins to the heat sink base. In another such embodiment, attaching the first end of the wire fin to the heat sink base comprises attaching all of the first loop ends to the heat sink base. In still another embodiment, attaching the first end of the wire fin to the heat sink base comprises attaching less than all of the first loop ends to the heat sink base. A further embodiment comprises attaching the wire fins to the heat sink base so that loops of each wire fin are staggered relative to loops of an adjacent wire fin.

In another embodiment, forming the wire fin comprises forming the loops at the first end to a shape that is complementary to the heat sink base. Another embodiment comprises forming a flattened surface on the loops at the first end. One such embodiment additionally comprises providing an end die configured to move relative the first, second and third dies, and forming the flattened surface by compressing the first end with the end die. In another such embodiment, forming the wire fin comprises forming the loops at the second end to a shape that is complementary to a second heat sink base surface, and the embodiment additionally comprises attaching loops at the second end to the second heat sink base surface.

Yet another embodiment additionally comprises removing the third die prior to removing the wire fin from between the first and second dies. One such embodiment additionally comprises compressing the wire fin further after removing the third die.

In a still further embodiment, the third die body has opposing first and second surfaces, the first surface being generally complementary to a surface of the first die body, the second surface being generally complementary to a surface of the second die body. In one such embodiment the first and second surfaces of the third die body are generally symmetrical. In another such embodiment the first and second surfaces of the third die body are not symmetrical.

In a yet further embodiment the first and second die bodies each comprise a plurality of wire guides configured to accommodate wires, and the elongate coiled wire comprises contiguous wire loops, and an embodiment additionally comprises aligning the contiguous wire loops with the wire guides prior to compressing the elongate coiled wire. Another such embodiment additionally comprises selecting an elongate coiled wire having a pitch between adjacent wire loops that is generally the same as a pitch between adjacent wire guides on the first die body.

In a further embodiment the first and second dies each have a wire forming face, and an embodiment additionally comprises deforming the elongate helical wire sufficient so that when the wire fin is formed portions its elongate loops are longer than the wire forming faces are wide so that the loops at the first end of the wire fin extend outwardly from between the first and second die wire forming faces. One such embodiment additionally comprises applying an end die to form the first end that extends outwardly into a desired shape.

DETAILED DESCRIPTION

Figure 1:
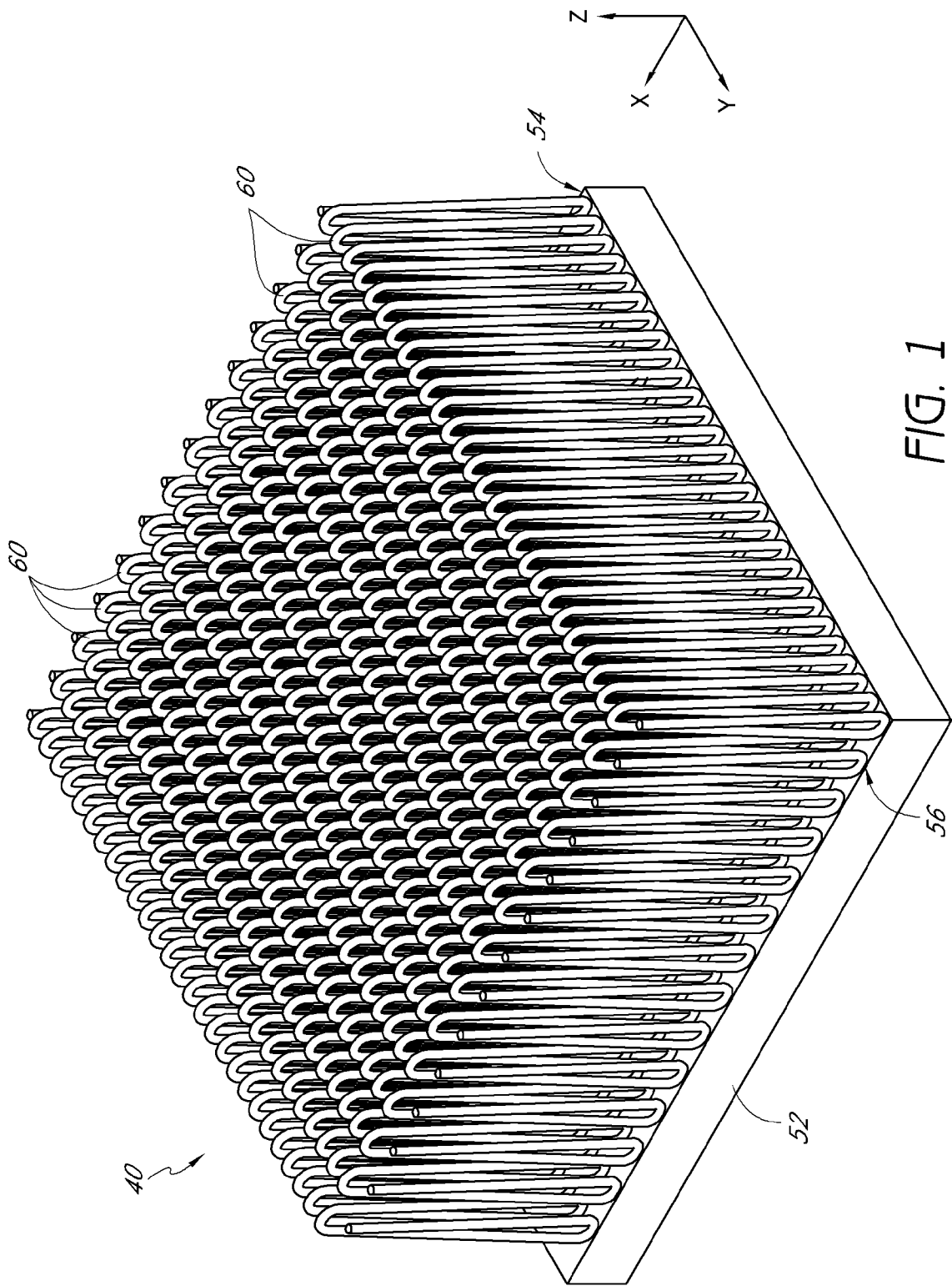
FIG. 1 is a perspective view of an embodiment of a heat sink having features according to the present invention.

With initial reference to FIG. 1, an embodiment of a heat sink 40 is illustrated. The heat sink 40 comprises a plurality of wire fins 60 and a base 52. The heat sink base 52 preferably is composed of a material that is thermally conductive and has good heat transfer properties, such as copper or aluminum. The wire fin 60 preferably is composed of a material that is malleable and has good heat transfer properties, such as copper, aluminum, or other heat conductive materials. The wire fin 60 is attached to the heat sink base 52 so as to provide good heat conductivity between the wire fin 60 and the heat sink base 52. Known or currently unknown methods including brazing, soldering and bonding can be employed.

Each wire fin 60 in the embodiment illustrated in FIG. 1 generally extends from a first edge 54 of the heat sink base 52 to an opposing second edge 56 of the heat sink base 52. The plurality of wire fins 60 preferably are oriented in substantially the same direction and in the same plane. The wire fins 60 can be spaced more or less closely than as shown in the embodiment of FIG. 1 in order to maximize the efficiency of heat transfer between the base 52 and the environment. Also, it is to be understood that various heat sink configurations can be employed. For example, a heat sink may have a large base plate, and groups of fins may be placed only in defined areas of the base plate, wire fins may be placed in a series configuration, a combination of regular and wire fins may be employed, the base may be curved, the wire fins may be curved in their application to the base, wire fins may be laid out according to polar coordinates, and the like.

In operation, the heat sink base 52 is placed in thermal communication with a heat source, such as a processor or component in an electrical or computer system. The thermal energy from the heat source is spread through the base 52 and transferred to the plurality of wire fins 60. The thermal energy is passed from the wire fins 60 to the environment. The increased surface area of the wire fins 60, relative to the surface area of the base 52, increases the efficiency and rate at which thermal energy is transferred to the environment. The environment is typically a gas, such as air, but may also be a liquid. In some embodiments the fluid of the environment is forced through the heat sink 40 in order to increase the rate heat is transferred to the environment.

Modifying the shape of the wire fins can affect the heat transfer characteristics of the heat sink, thus changing the heat transfer rate of the heat sink. Ideally a heat sink will evacuate heat sufficiently to maintain the heat source below a temperature that would damage the components or decrease efficiency.

Figure 2:
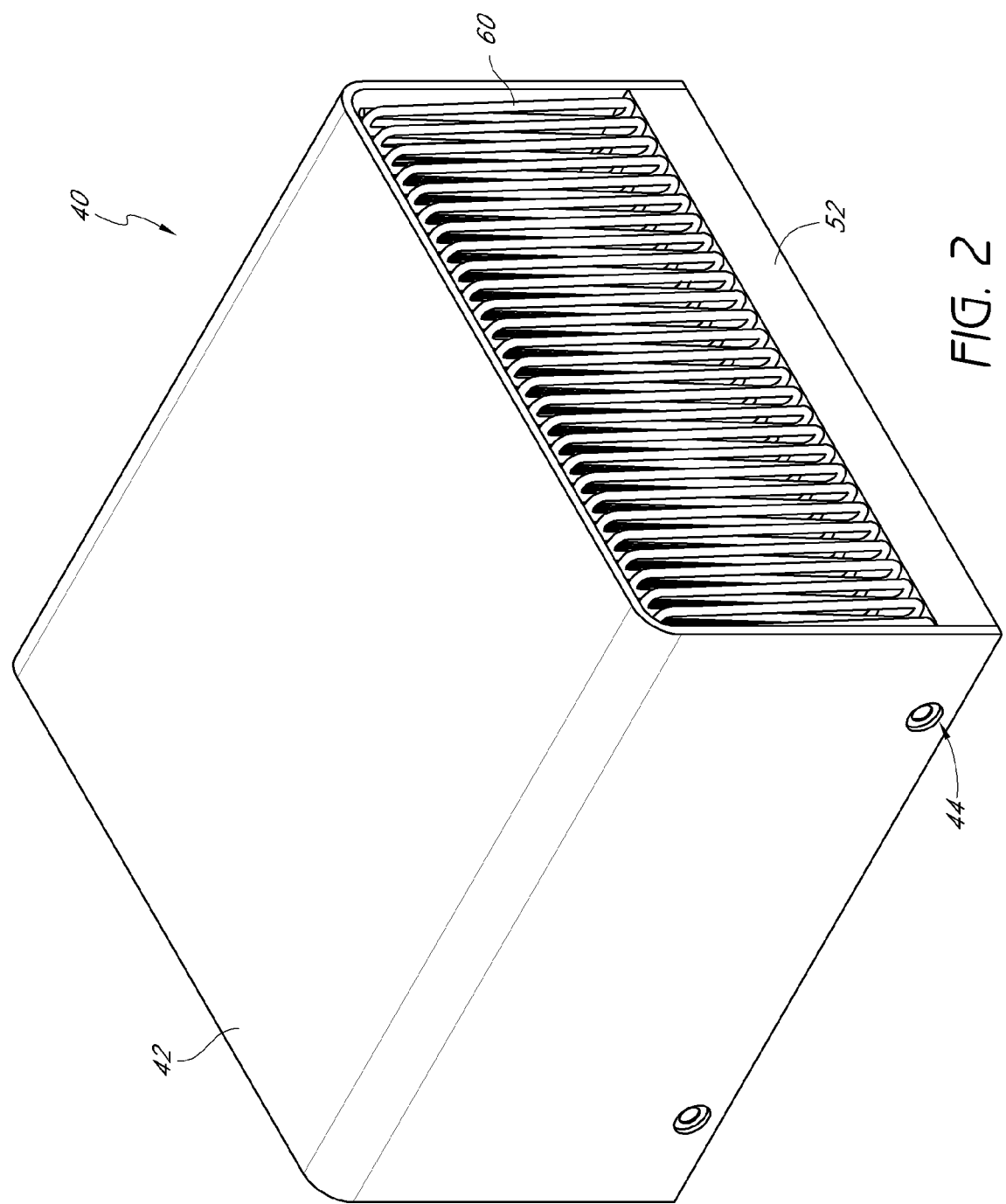
FIG. 2 shows the heat sink of FIG. 1 having an enclosure.

Referring now to FIG. 2, an enclosure 42 has been coupled with the heat sink 40. The enclosure 42 is mounted to the heat sink base 52. In some embodiments the enclosure may be mounted directly to the heat-creating system or componentry. The illustrated enclosure 42 is mounted by fasteners 44, but in other embodiments may be attached by any appropriate method or structure, such as soldering, brazing, bonding, clipping, or the like.

The enclosure 42 preferably encapsulates the wire fins 60 of the heat sink 40 so that a fluid can be channeled through the heat sink along a single axis. The enclosure 42 can also provide additional heat transfer between the source and the environment. In some embodiments, forcing air along a specific axis can beneficially affect the heat transfer rate because the wire fins 60 may have different heat transfer properties depending upon the direction of the fluid flow. In some embodiments the enclosure attaches to the wire fins at a location opposite their attachment to the base. It is to be understood that other embodiments can employ enclosures having various configurations. For example, in one embodiment an enclosure is configured to receive a fluid input from the top and direct fluid through the heat sink and to one or more sides.

Figure 3:
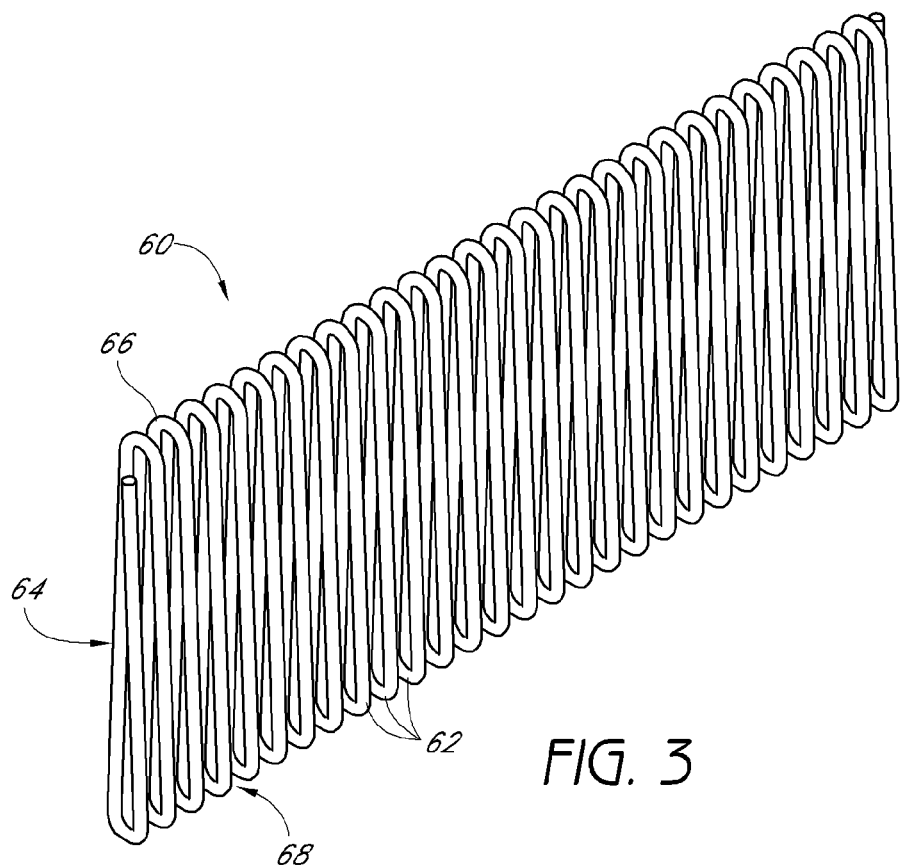
FIG. 3 is a perspective view of an embodiment of a wire fin.
Figure 4:
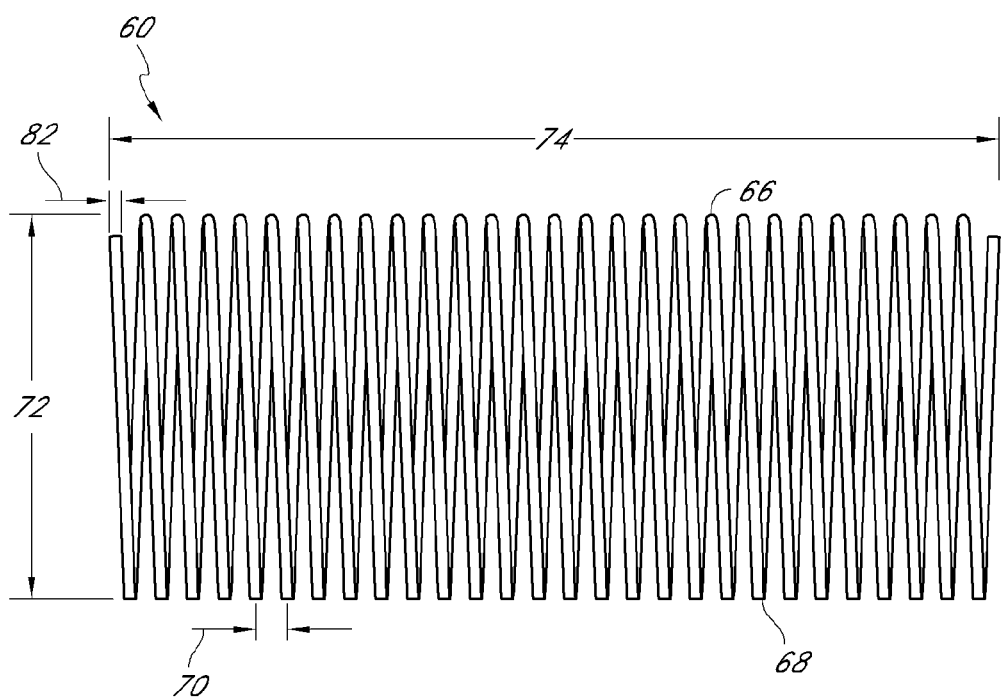
FIG. 4 is a side view of the wire fin of FIG. 3.

FIGS. 3 and 4 illustrate an embodiment of one of the wire fins 60 used in the heat sink 40 shown in FIGS. 1 and 2. In this embodiment the wire fin 60 is manufactured from a single, contiguous wire member, although some embodiments may employ multiple wire members bonded or otherwise joined together. The illustrated wire fin 60 is a coil comprised a plurality of contiguous loops 62. The wire fin may be manufactured with a specific height 72, length 74, pitch 70, and wire diameter 82 as desired.

Figure 5:
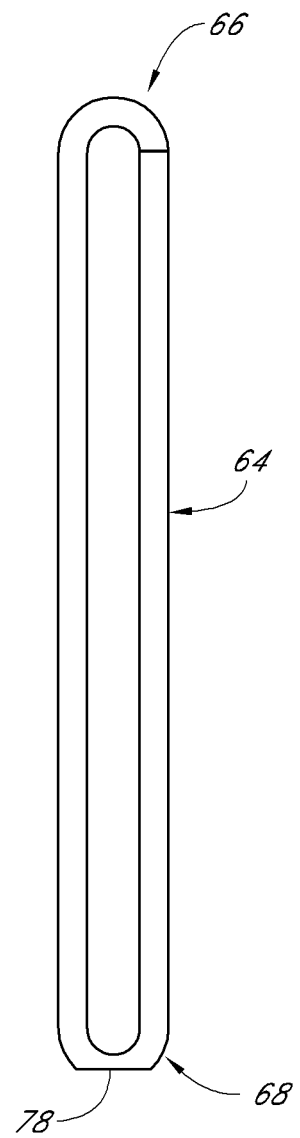
FIG. 5 is an end view of the wire fin of FIG. 3.

FIG. 5 illustrates a loop 62 of the wire fin 60. In this embodiment of the wire fin 60 each loop 62 has the same shape, and comprises a first end 66, a second end 68, and a body section 64. In this embodiment, the first end 66 and second end 68 are not symmetrically shaped. More specifically, the second end 68 of each loop 62 comprises a substantially flat surface 78, thus simplifying the process of connecting the second ends 68 to the heat sink base 52. In some embodiments the first and second ends 66, 68 may be symmetrical. Most preferably, at least one end is shaped to complement the surface to which it will be mounted.

Figure 6B:
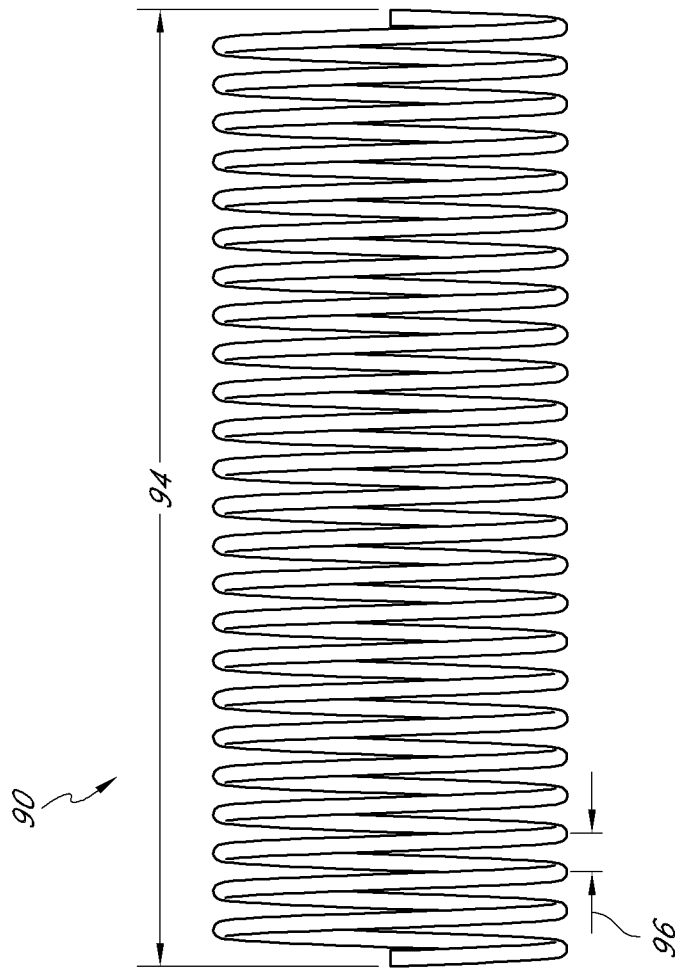
FIG. 6B is a side view of the helical wire member of FIG. 6A
Figure 6A:
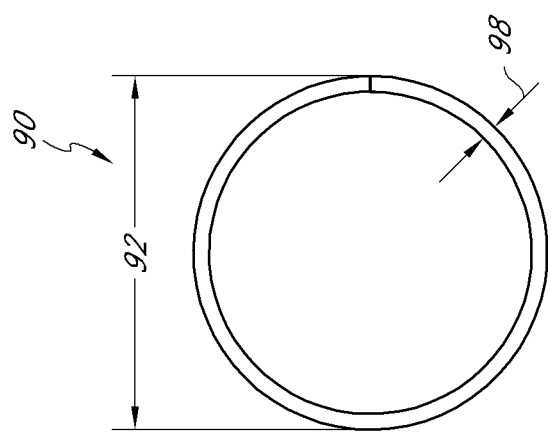
FIG. 6A is an end view of a helical wire member prior to being formed into a wire fin.

FIGS. 6A and 6B illustrate a coiled wire member 90 having a helical shape, such as a spring-like shape. The coiled wire member 90 can be used as a source material from which to manufacture a wire fin 60 such as that illustrated in FIGS. 3-5. The wire member 90 is preferably manufactured from a malleable material that has a high thermal conductivity, such as aluminum. The helical wire member 90 is typically defined by the length 94, pitch 96 and diameter 92, and additionally by its wire diameter 98. The illustrated wire member 90 is made up of generally circular loops, although in some embodiments the wire member may have loops that are elliptical or another shape.

Figure 7:
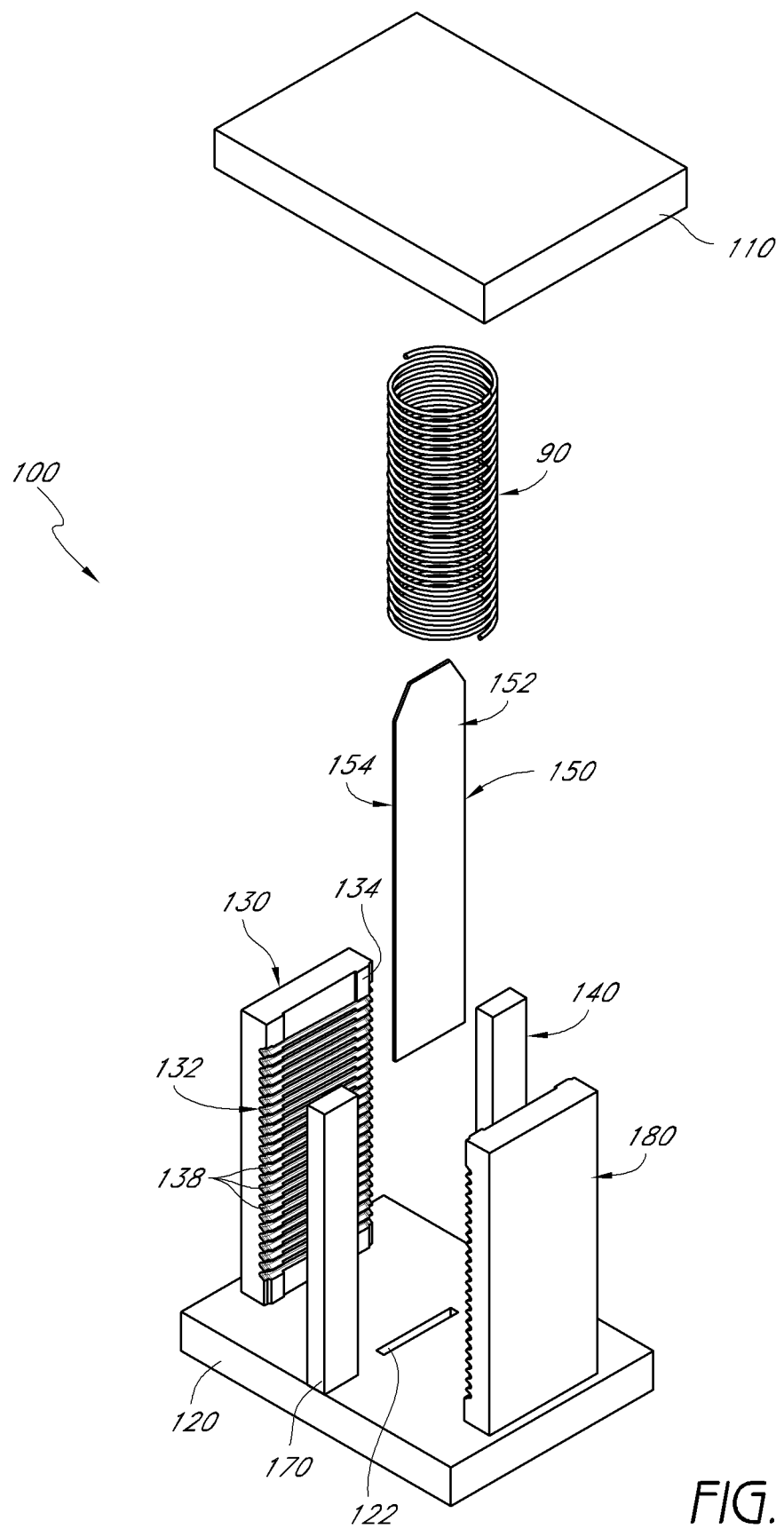
FIG. 7 is an exploded perspective view of one embodiment of a wire fin forming press and a helical wire member.

FIGS. 7-12 illustrate an embodiment of a wire forming press 100 for forming a wire fin 60 from a wire member 90. With particular reference to FIG. 7, in this embodiment the forming press comprises an upper plate 110, a first forming die 130, a second forming die 180, a third or center die 150, a first end die 140, a second end die 170, and a base plate 120.

In the illustrated embodiment, the center die 150 is a substantially flat elongate body having a first face 152 and a second face 154. With additional reference to FIG. 8, the center die 150 is sized so that the wire member 90 fits around the center die 150. Further, the center die 150 fits in a slot 122 in the base plate 120. Preferably the slot 122 is shaped complementarily to the cross-sectional shape of the center die 150. With additional reference to FIG. 9, preferably the upper plate 110 fits atop the dies and preferably also comprises a slot (not shown) or other structure that receives the center die 150.

The first forming die comprises a wire fin forming region 132 and a stop face 134. In this embodiment the wire forming region 132 extends the width of the first forming die 130 and has a plurality of guides 138 configured to accommodate and engage one or more wires of the wire member 90. Preferably the guides 138 comprise slots or other structures arranged at a pitch generally corresponding to the pitch of the loops in the wire member 90. In additional embodiments the wire forming region 132 may not have any guides. Further, the wire forming region 132 may have a roughened surface or another surface treatment configured to resist slippage of the wire member 90 when engaged during operation of the press 100.

The first forming die 130 is positioned opposite the second forming die 180 and, in the illustrated embodiment, has substantially the same construction. The first forming die 130 and the second forming die 180 are also generally coupled with the base plate 120 and may engage the upper plate 110. The first and second dies are movable relative to each other and toward the center die 150 so as to deform the wire member 90, which is wrapped about the center die 150. Preferably the first and second end dies 140, 170 are also coupled with the base plate 120 and/or the upper plate 110, are positioned opposite each other, and are configured to move in a direction generally perpendicular to the movement of the forming dies 130, 180. The first and second end dies 140, 170 are generally coupled to the base plate 120 and/or the upper plate 110.

The forming dies may be manufactured from any material hard enough to engage, compress, and deform the wire member without the die deforming significantly. Many plastics, ceramics and metals would be suitably employed in the dies.

Figure 8:
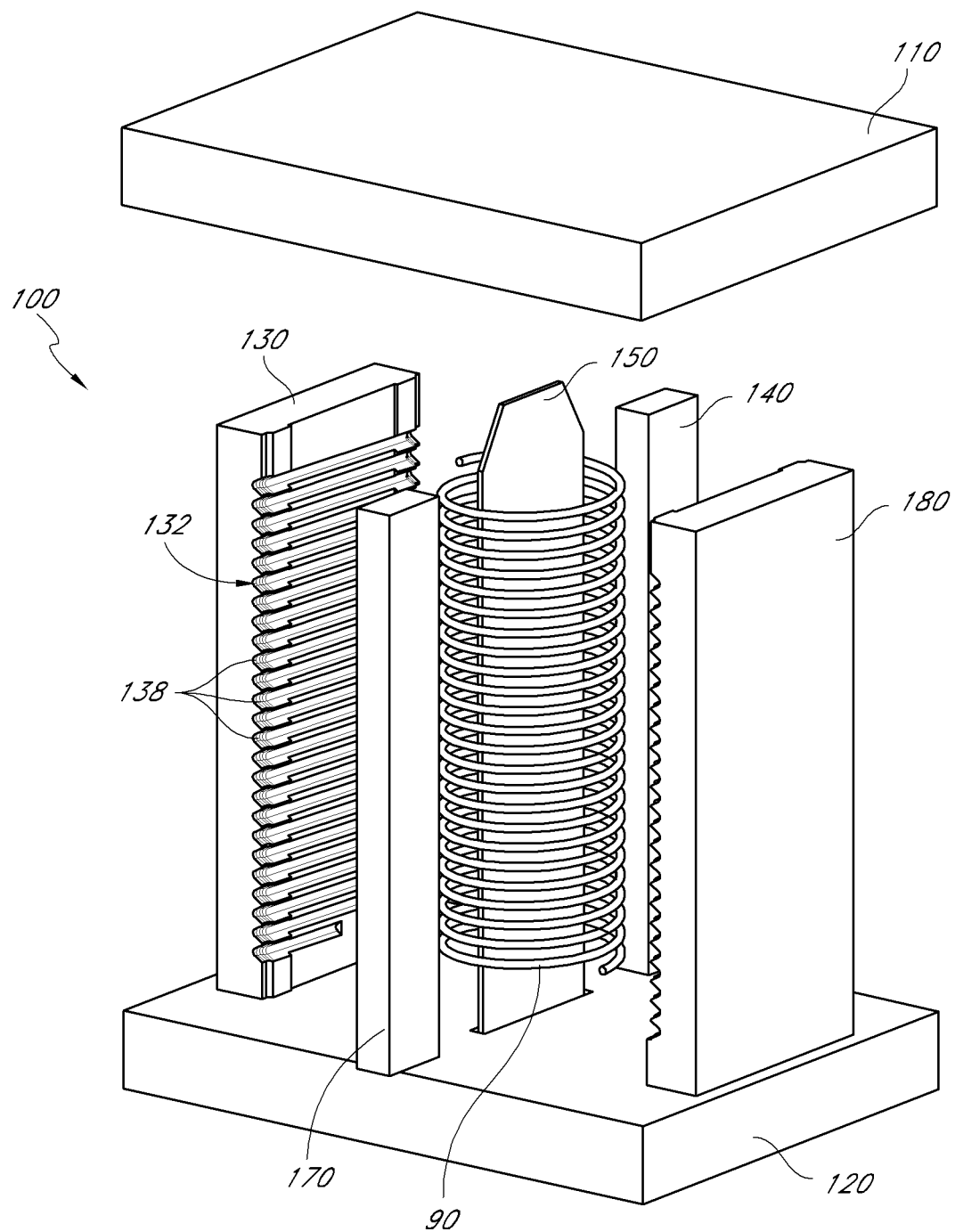
FIG. 8 shows the apparatus of FIG. 7 partially assembled.
Figure 9:
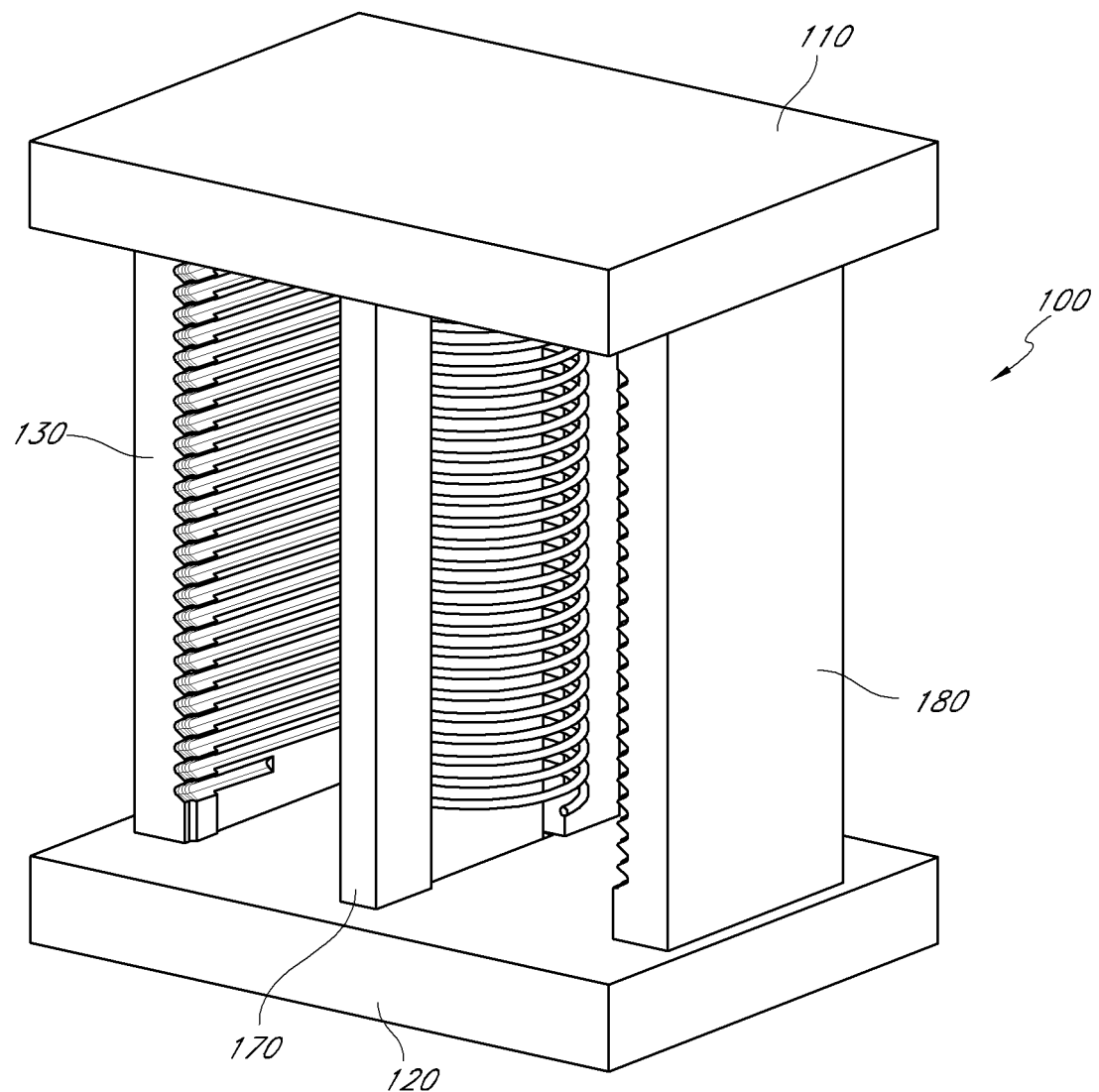
FIG. 9 shows the apparatus of FIG. 7 assembled.

With continued reference to FIG. 7-12 and particularly to FIGS. 7-9, during operation the press 100 is loaded when the wire member 90 is positioned about the center die 150 and the center die 150 is positioned within the slot 122 of the base plate 120. In some embodiments the center die is secured to the base plate 120. The upper plate 110 is then engaged. In some embodiments, the upper plate 110 may be locked into position by an external fastening device, thereby restricting movement of the upper plate. In some embodiments, the upper plate may be secured in place by engaging at least one of the forming dies 130, 180 or end dies 140, 170.

When loaded in the press, the first and second forming dies 130, 180 may be advanced toward the wire member 90 sufficient to enable any desired adjustments to ensure the wire member 90 properly lines up with the guides 138 on the first and second forming dies 130, 180. In some embodiments the guides may self-align the wire member 90 during the forming process. In some embodiments the end dies 140, 170 may also be at least partially advanced to engage and position the wire member 90.

Figure 10:
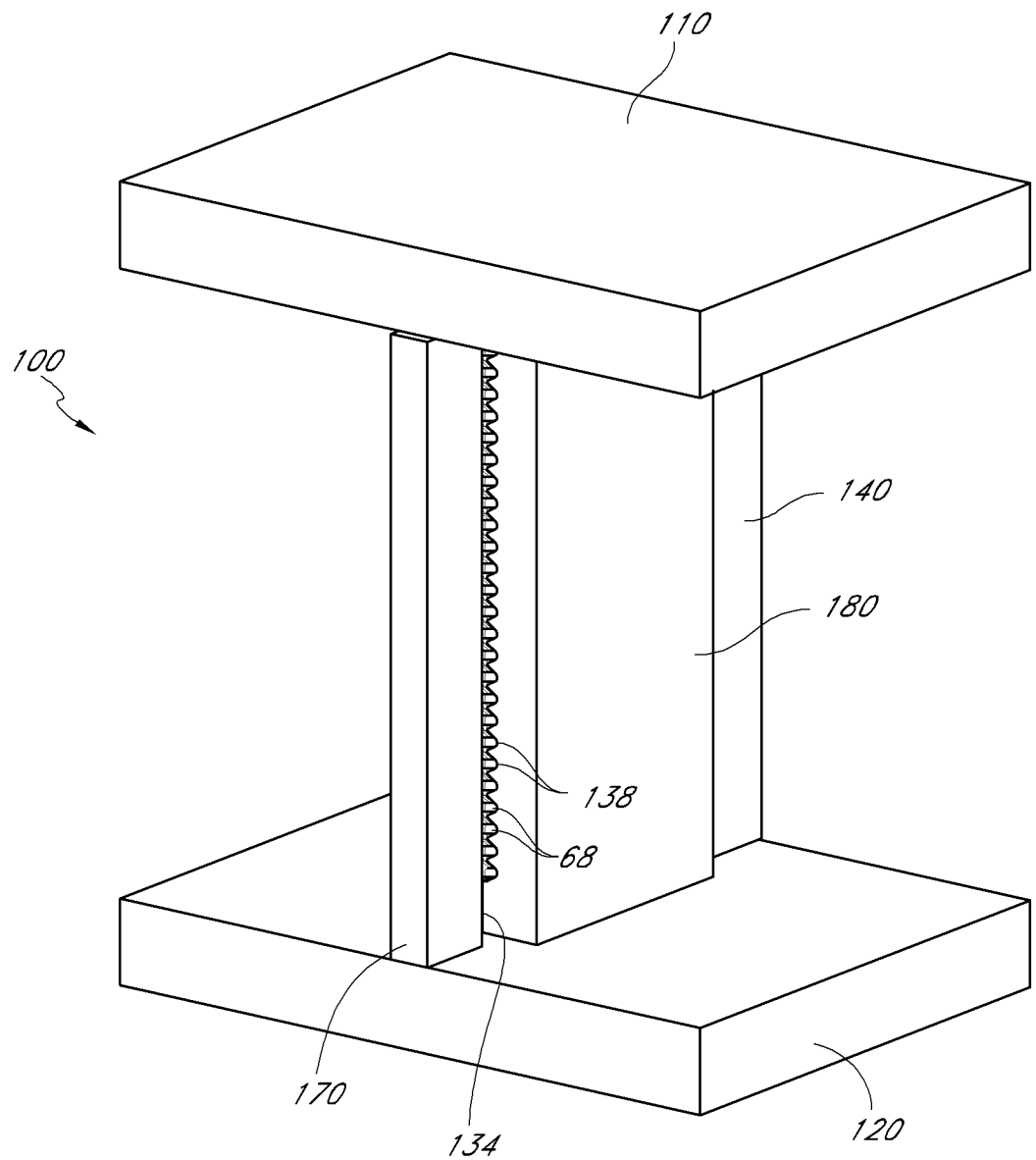
FIG. 10 shows the apparatus of FIG. 7 during a pressing operation.

With additional reference to FIG. 10, the first forming die 130 and the second forming die 180 are moved toward the center die 150 so as to compress the wire member 90 about the center die 150. Preferably the stop faces 134 of the first and second dies 130, 180 engage one another to stop relative movement at a desired point. During such compression the wire member 90 is plastically deformed to form the wire fin 60. The body section 64 of the wire fin 60 takes on the shape dictated by the cooperating first, second and third dies 130, 180, 150. In some embodiments relative movement of the dies is regulated by, for example, and electronic controller rather than stop faces.

During operation of the press 100, the center die 150 maintains the position of the wire member 90 and in conjunction with the first and second forming dies 130, 180 forms the wire member 90. The guides 138 help control the positioning of the wire member and may also maintain or set a specific pitch of the coils of the wire fin 60.

As shown particularly in FIG. 10, during operation of the press 100 according to the illustrated embodiment the first and second ends 66, 68 of the wire fin 60 that is being formed from the wire member 90 are forced out of the edges of the forming dies 130, 180. The first and second end dies 140, 170 are advanced so as to engage and deform the first and second ends 66, 68 of the wire fin 60 to a desired shape as in the wire fin 60 embodiment illustrated in FIG. 5. In additional embodiments the wire fin 60 will not extend beyond the edge of the forming dies 130, 180.

In some embodiments, rather than deform the ends 66, 68, the end dies 140, 170 may maintain the wire member 90 in a proper position during a portion or all of the forming operation. In further embodiments, one or more of the end dies 140, 170 may be incorporated into the forming dies 130, 180. In such embodiments the wire forming region will not extend across the entire width of the dies, but a portion of the die will be configured to form one of the ends 66, 68.

In the illustrated embodiment the upper and base plates 110, 120 provide support and stability for the dies. In some embodiments, the base plate 120 and/or the upper plate 110 may have guides that control the direction of movement of the forming dies 130, 180 and/or end dies 140, 170. Further, the plates 110, 120 secure the center die 150 relative to the other dies.

The upper plate 110 is secured in place by engaging the forming dies 130, 180 and/or the end dies 140, 170. When the upper plate 110 is secured in place the center die 150 may continue to be manipulated through a slot 122 in the base plate 120. In some embodiments the upper plate 110 may have a similar slot, which allows the center die 150 to be manipulated when the upper plate 110 is secured in place. In some embodiments, the upper plate 110 may detachably engage the center die 150, which would help position and restrict movement of the center die 150 during operation of the press 100.

In operation of the press 100, the end dies 140, 170 may move in concert with the forming dies 130, 180, such that the ends 66, 68 of the wire fin 60 are shaped and formed concurrently with the body 164 of the wire fin 60. In some embodiments, the end dies 140, 170 shape the ends 66, 68 of the wire fins 60 after the forming dies 130, 180 have closed. The first and second end dies 140, 170 may act independently and may form one or both ends, which may in some embodiments be symmetrical and in other embodiments be formed into different shapes. Further, it should be understood that some embodiments may employ only a single end die, which imparts a desired shape, such as a flat mounting surface, on only one of the ends 66, 68.

Figure 11:
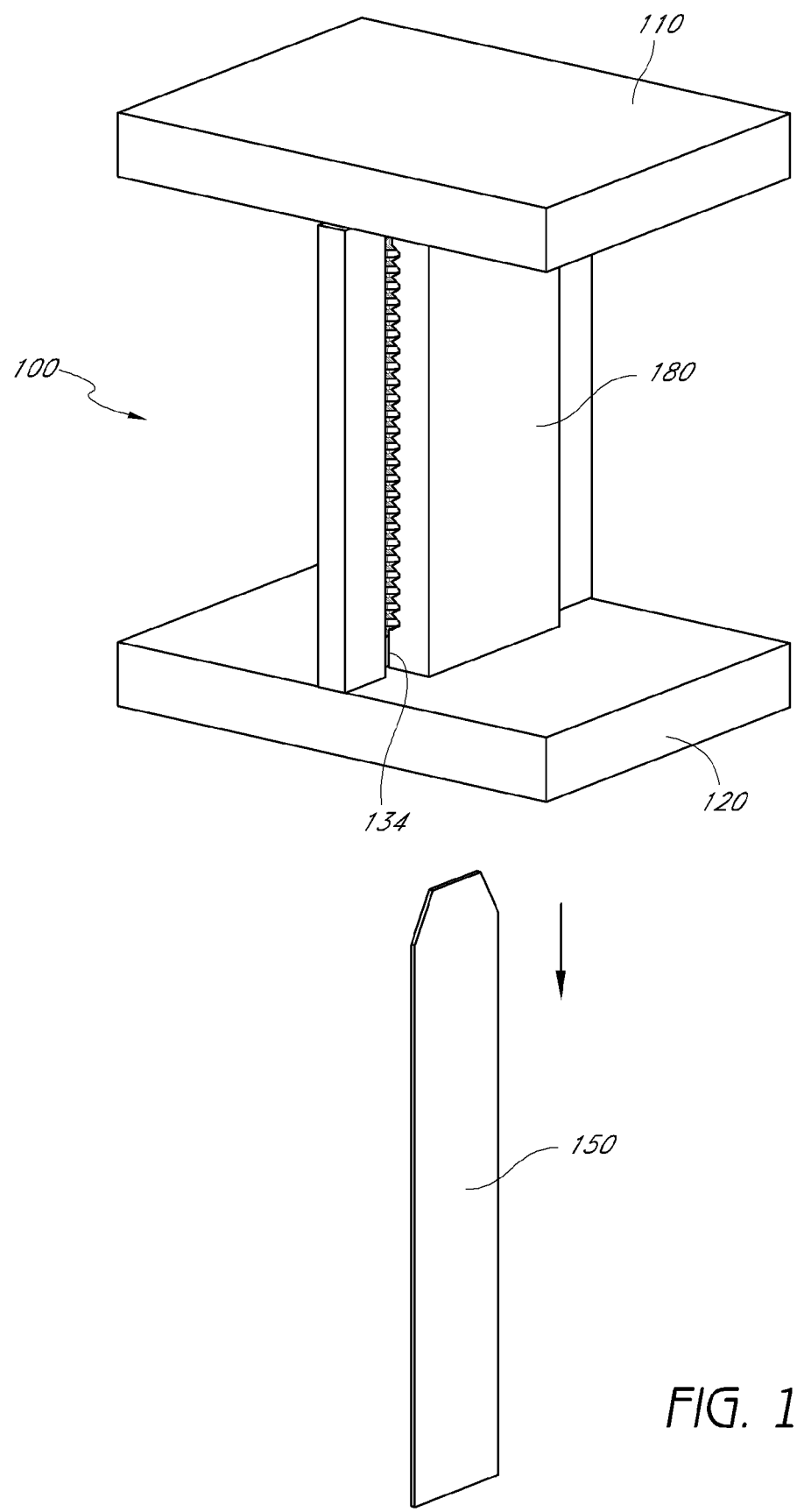
FIG. 11 shows the apparatus of FIG. 7 at a further stage of operation in accordance with one embodiment.

With reference next to FIG. 11 the center die 150 may be removed after the forming dies 130, 180 have closed to form the wire fin 60, but before the dies 130, 180 are opened to release the formed wire fin 60. In a preferred embodiment the first and second forming dies 130, 180 are opened slightly, preferably less than the diameter of the wire and more preferably less than half the diameter of the wire, and the center die 150 is withdrawn from between the first and second forming dies 130, 180 and the wire fin 160. The illustrated center die 150 is withdrawn through the slot 122 in the base plate 120, and the dies 130, 180 continue to exert a holding force on the wire fin 60 sufficient to resist deformation of the fin as the center die is removed. In some embodiments the center die 150 may be withdrawn through a slot in the upper plate 110. In further embodiments the center die 150 is removed without significantly opening the forming dies 130, 180. Preferably the faces 152, 154 of the center die 150 are substantially smooth along the length of the die so as to facilitate sliding of the die through the compressed wire fin 60.

Figure 12:
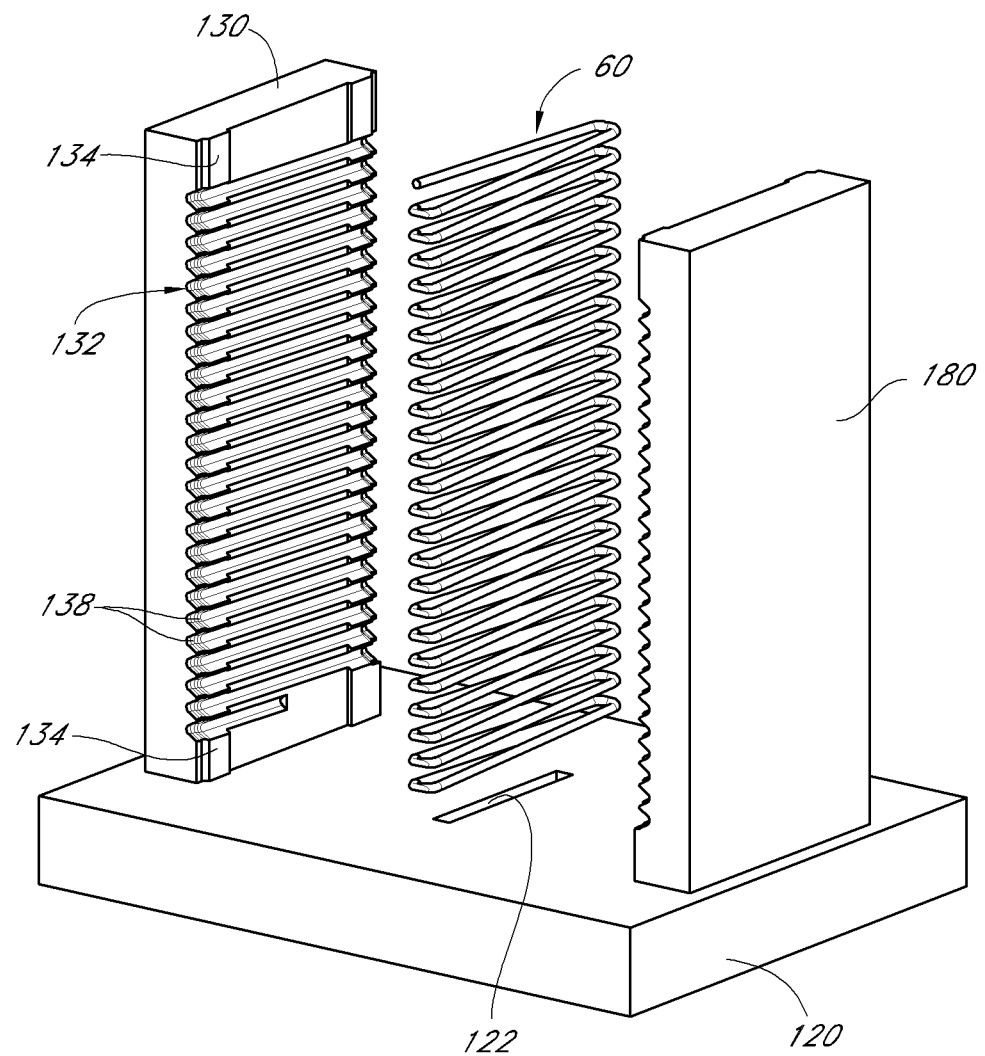
FIG. 12 is a partial view showing the apparatus of FIG. 7 after a pressing operation.

After the center die 150 is removed, the forming dies 130, 180 and the end dies 140, 170 are moved away from the wire fin 60, and the upper plate 120 is removed. FIG. 12 illustrates the wire fin 160 after the process is complete.

The wire fin press 100 may be externally operated and controlled by a suitable control system. A single control system may control the entire system or a plurality of control systems may be utilized to control individual components of the press 100. The method is not limited to any particular system or apparatus and any system capable of practicing the method described above may be used, whether it be mechanical, hydraulic, pneumatic, or electrical. The method may also be practiced manually by physically manipulating each piece to follow the method described above.

With additional reference again to FIG. 1, once the wire fin 60 is formed, it can be attached to the base 52 as discussed above. Preferably several fins 60 are attached to the base adjacent one another in a relatively closely-packed arrangement. In the illustrated embodiment wire fins 60 are disposed immediately next to one another. In other embodiments adjacent wire fins may be staggered so as to at least partially overlap and thus be even more closely packed. As shown, each loop of each wire fin 60 provides the equivalent of two heat sink pins. And each wire fin has several such loops. Accordingly, the present method provides for manufacture of many heat sink pins in one manufacturing action, and also provides for mounting of a group of such pins on a heat sink base 52 in one assembly action. Construction of the heat sink 40 can thus be simply and efficiently accomplished.

Figure 13:
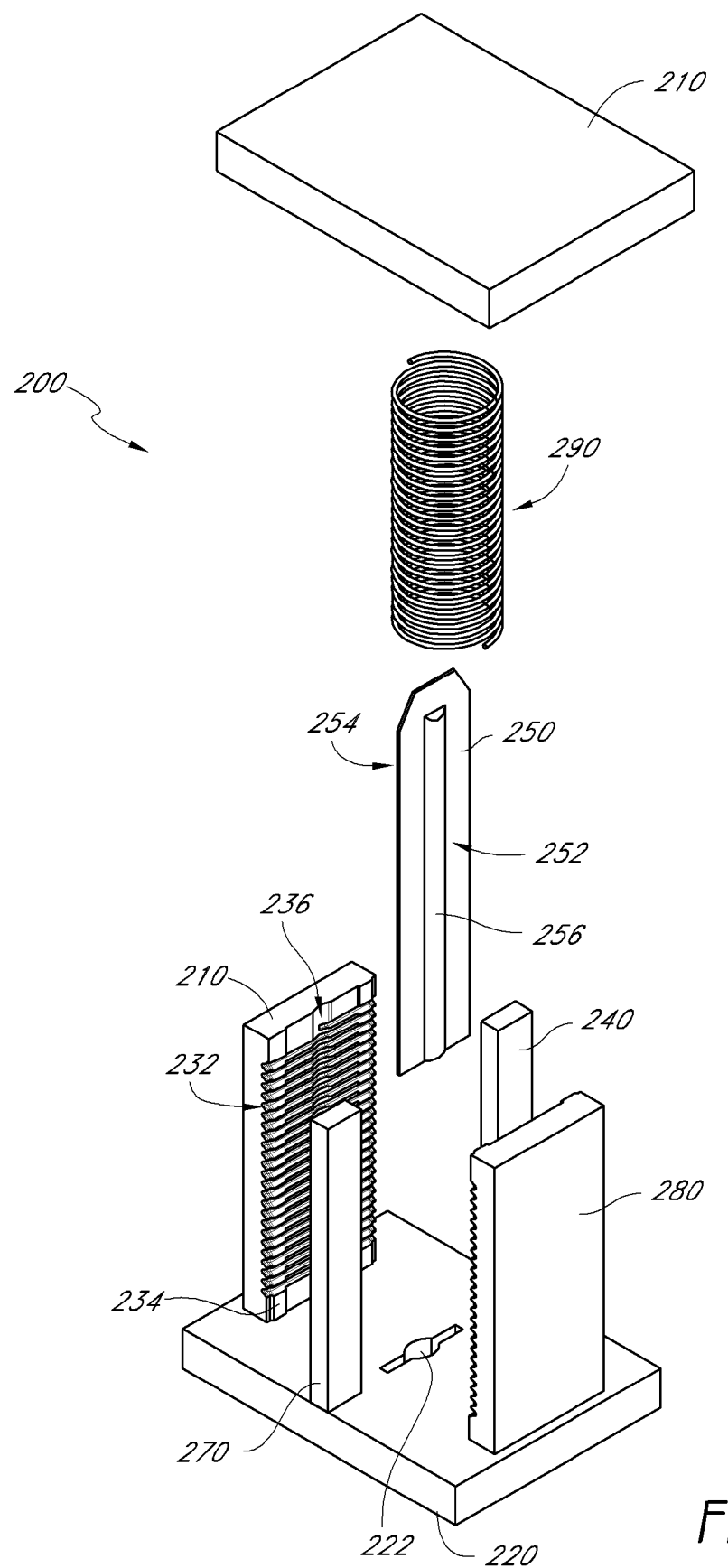
FIG. 13 is an exploded perspective view of another embodiment of a wire fin forming press and a helical wire member.

FIGS. 13-16 illustrate another embodiment of a wire forming press 200 having features similar to the wire forming press 100 in FIG. 7. More particularly, FIG. 13 illustrates the wire forming press 200 as comprising an upper plate 210, a first forming die 230, a second forming die 280, a center die 250, a first end die 240, a second end die 270, and a base plate 220. This embodiment of the wire forming press 200 generally follows the method embodiments described in connection with FIGS. 8-12.

In this embodiment the center die 250 has a first face 252 and a second face 254. The first and second faces 252, 254 each have an elongate bulging shape 256 extending outwardly from the face. The shape 256 extends from the base of the die to near the tip. A slot 222 in the base plate 220 preferably matches the cross-sectional profile of the center die 250.

Figure 14:
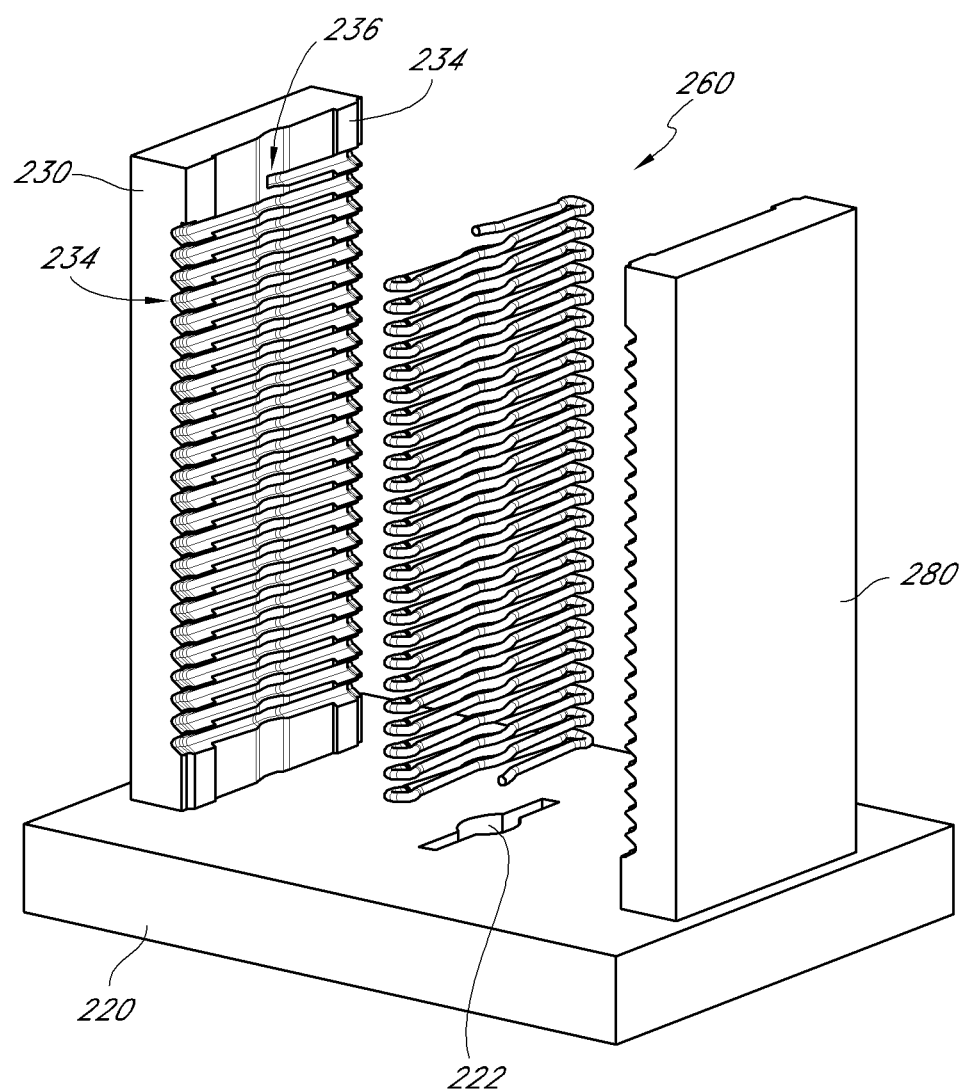
FIG. 14 is a partial view showing the apparatus of FIG. 13 after a pressing operation.
Figure 15:
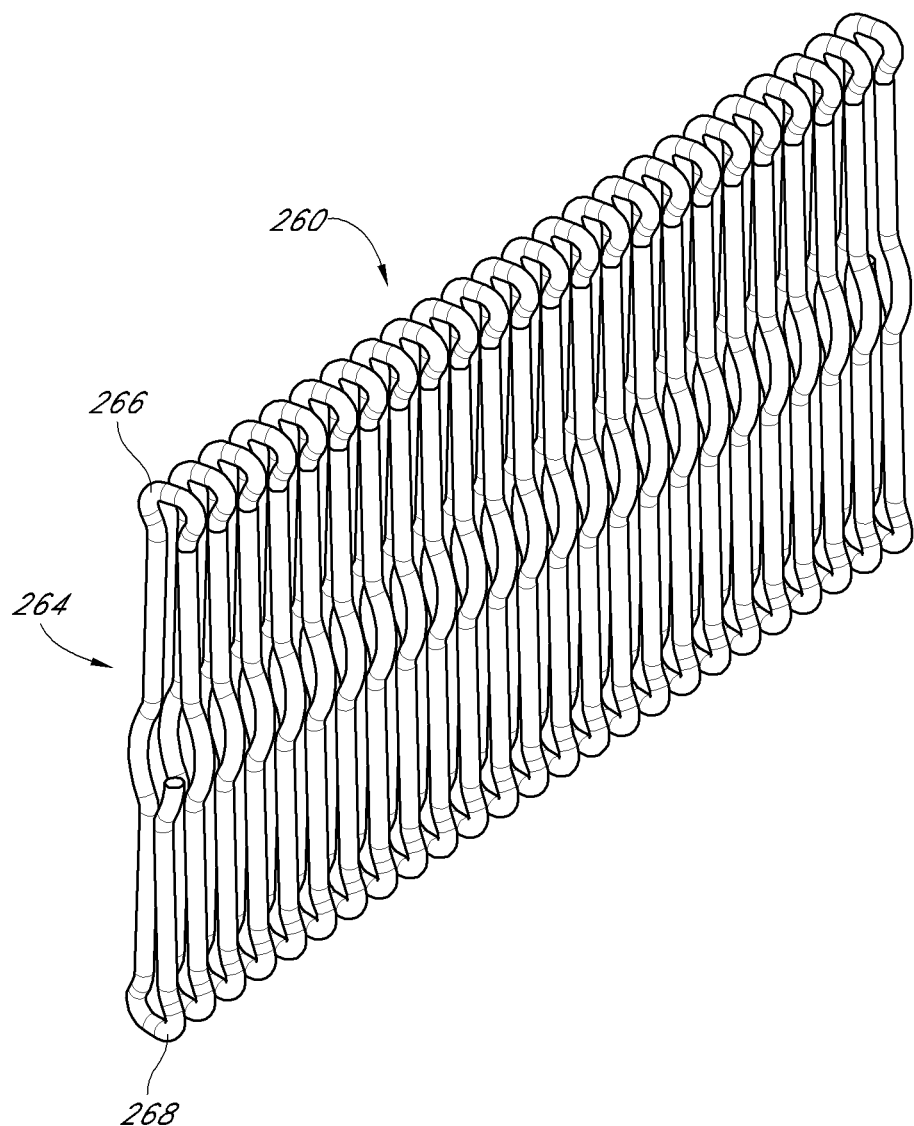
FIG. 15 is a perspective view of an embodiment of a wire fin formed by the apparatus of FIG. 13.
Figure 16:
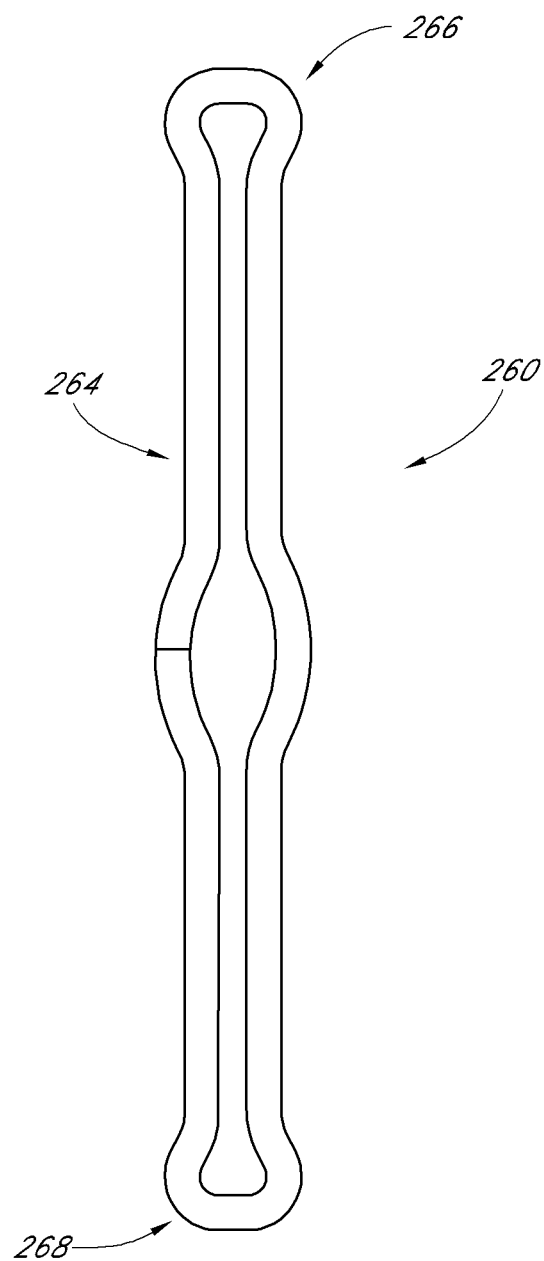
FIG. 16 is an end view of the wire fin of FIG. 15.

The first forming die 230 has a wire forming region 232 and a stop face 234. The wire forming region 232 has a recess 236 positioned and shaped to correspond to and complement the shape 256 on the center die 250. During the forming process the first and second forming dies 230, 280 will press the wire member 290 onto the center die 250. As shown in FIGS. 14-16 the body 264 of a wire fin 260 formed by this process has substantially the same shape as the center die 250 and corresponding forming dies 230, 280. Preferably first and second end dies 240, 270 form the shapes of the first and second end sections 266, 268.

In this embodiment the shape 256 is uniform. In some embodiments a center die may have a shape that is not uniform along its length. For example, in one embodiment a bulging shape extends outwardly from the surfaces of the center die, and tapers from the base of the die to the tip so that the bulge is more pronounced at or near the base than at or near the tip. Such an embodiment may facilitate removal of the center die after shaping is complete.

It should be appreciated that, in additional embodiments, modifications can be made to the shapes of the dies in order to create a vast array of wire fin shapes. In some embodiments, the slot in the corresponding base plate is shaped complementarily to the center die. In other embodiments, the base plate has a space for an insert, which insert includes the slot. Thus, the same base plate may be used with a plurality of center dies by interchanging an insert carrying the corresponding slot. In still further embodiments the slot is relatively large without necessarily corresponding to any particular center die profile, but due to its size and shape it can accommodate a wide range of center die profiles.

Figure 17:
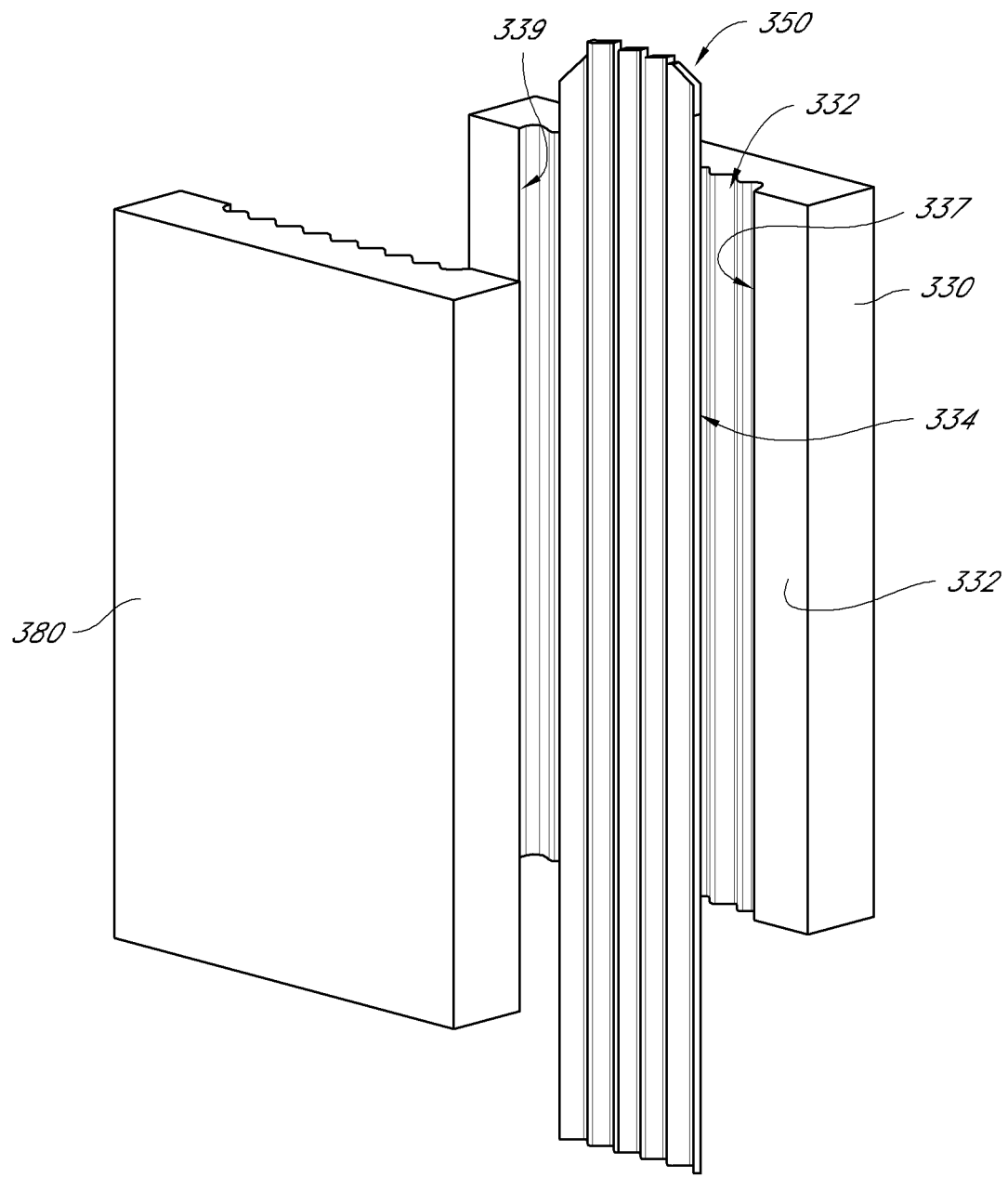
FIG. 17 is a partial perspective view of another embodiment of a wire fin forming press.
Figure 18:
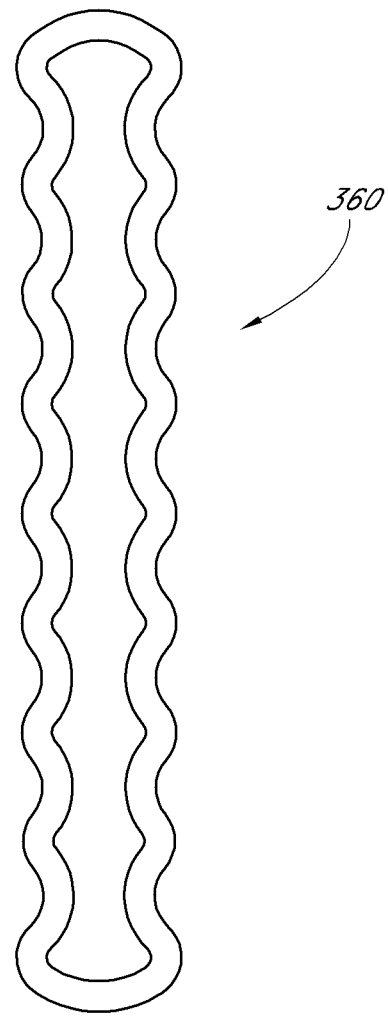
FIG. 18 is an end view of an embodiment of a wire fin formed by the apparatus of FIG. 17.

FIGS. 17 and 18 illustrate another embodiment of a center die 350 and first and second forming dies 330, 380. The center die 350 and forming dies 330, 380 may be used in the wire forming press described in FIGS. 7 and 13, or may be used in any type of press that will suitably support and operate the dies. In the illustrated embodiment the first forming die 330 and the second forming die 380 are substantially the same. The first forming die comprises a wire forming region 332 and a stop face 334. The wire forming region 332 has a first end forming region 337, a body forming region 336, and a second end forming region 339. There are no boundaries between the regions and generally there is some overlap. The body forming region 336 is the largest area of the die and generally shapes the body section of the wire member, the first end forming region 337 shapes the first end of the wire fin, and the second end forming region 339 shapes the second end of the wire fin.

The faces of the center die 350 in the illustrated embodiment each have a generally corrugated profile, which is generally complementary to the forming regions of the forming dies 330, 380. The center die 350 does not generally extend to the first and second end forming regions 337, 339 of the forming dies 330, 380. FIG. 18 illustrates the profile of a wire fin 360 created using the forming dies and center die as illustrated in FIG. 18.

With reference next to FIGS. 19-22, another embodiment of a wire fin forming press 400 comprises a first forming die 430, a second forming die 480, and a center die 450. As with embodiments discussed above, the press 400 is generally used to deform a coiled wire member 490 into a wire fin 460 for use in a heat sink.

The illustrated first forming die 430 and second forming die 480 are generally matching dies. The first forming dies comprise a wire forming region 432 and a stop face 434. In this embodiment the sire forming region 436 has guides 438 that help orient and position the wire member 490 before the forming process. Each guide 438 accommodates a portion of a wire loop.

Figure 19:
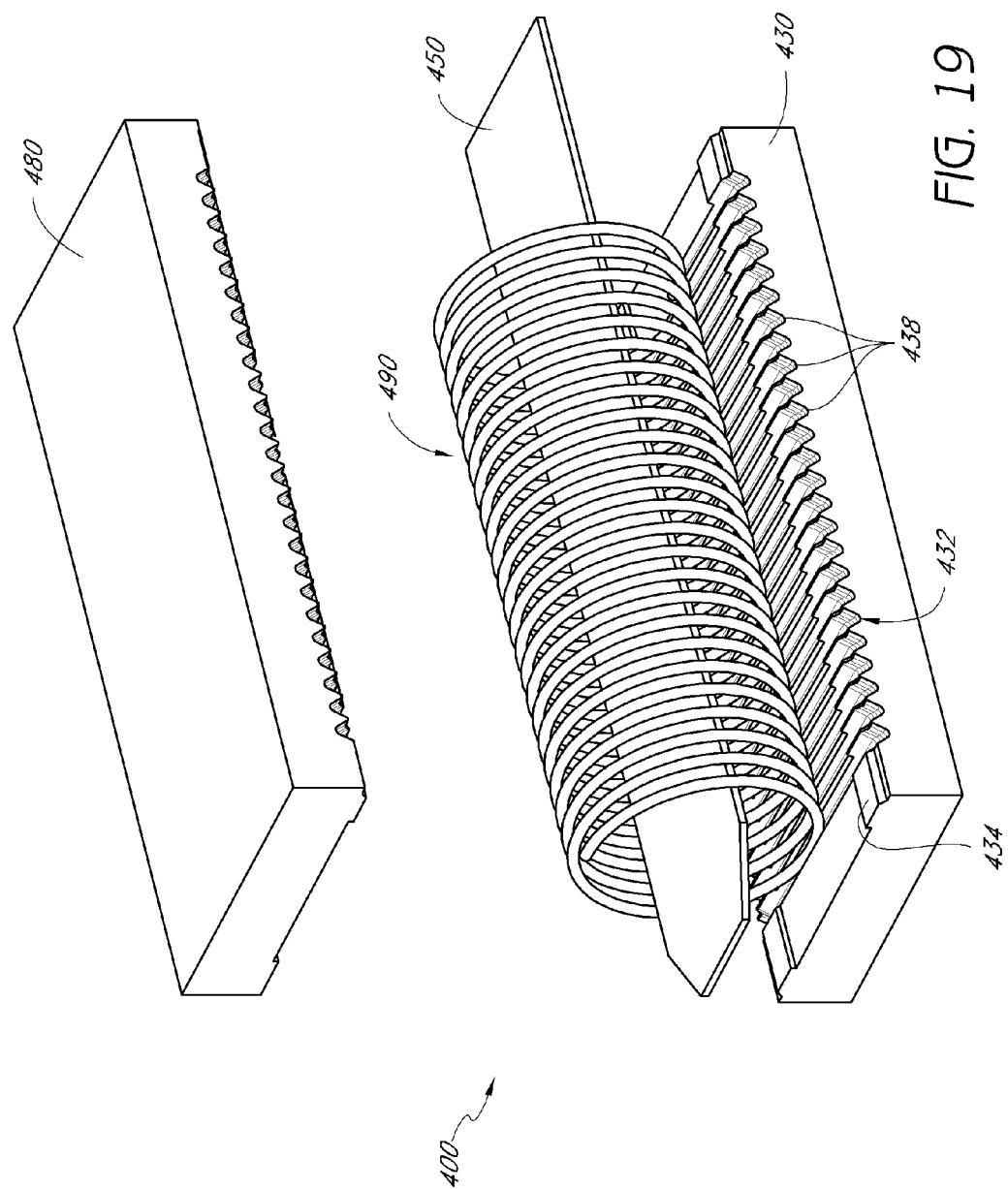
FIG. 19 is a partial perspective view of another embodiment of a wire fin forming press.

The center die 450 is a substantially elongate flat body which, as shown in FIG. 19, can be positioned between the first and second forming dies 430, 480. Surfaces of the center die preferably are complementary to the first and second die 430, 480 wire forming region 432. As such, when deformed in the press, the wire member 490 will take a shape generally corresponding to the profile of the center die 450.

In the illustrated embodiment, the first and second forming dies 430, 480 are disposed vertically above one another, and the first forming die 430 is stationary and mounted on a surface. The second forming die 480 moves relative to the first forming die 430 along an axis tangential to the stop face 434 of the die 430.

In operation, the wire member 490 is fit about the center die 450 and the wire member 490 is placed on the first forming die 430 so that loops of the wire member are aligned in corresponding guides 438. In the illustrated embodiment, the center die is substantially unsupported, or floating. In some embodiments the center die 450 may be secured in place by an external force or apparatus. In further embodiments the center die 450 is not used and the wire member 490 is placed on the first forming die 430 without the center die 450. In still further embodiments, after removing the center die the first and second dies further compress the wire member.

Figure 20:
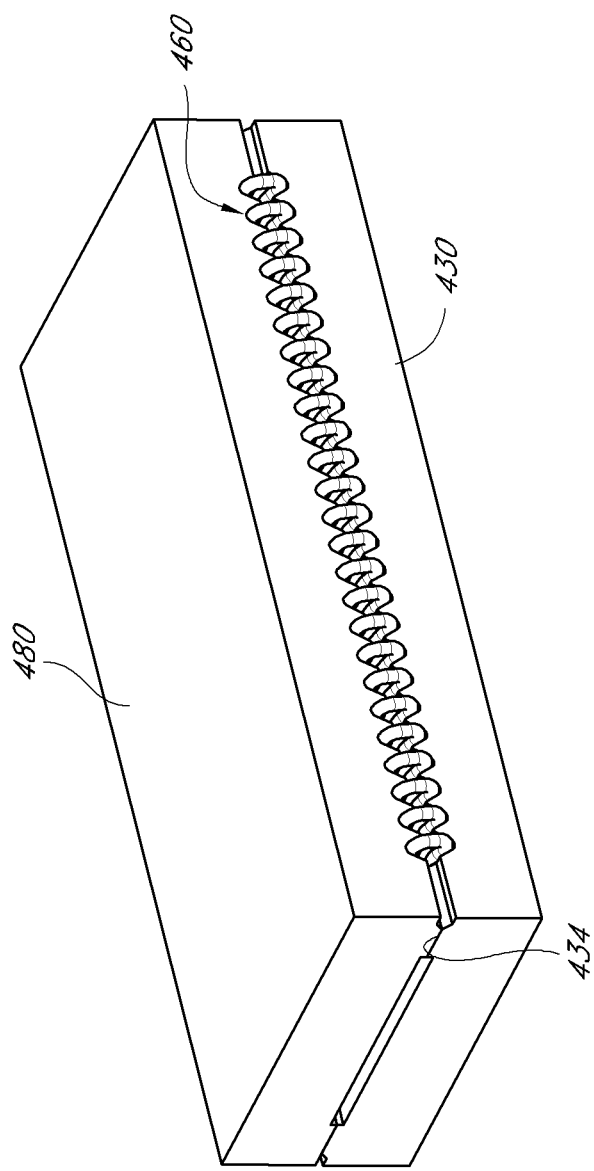
FIG. 20 shows the apparatus of FIG. 19 during a pressing operation.

After the wire member 490 has been appropriately positioned, the second forming die 480 is moved along the axis until the stop face of the second forming die 480 comes in contact with the stop face 434 of the first forming die 430 as shown in FIG. 20. As in embodiments discussed above, the wire member 490 is deformed by this process into a wire fin 460.

Figure 21:
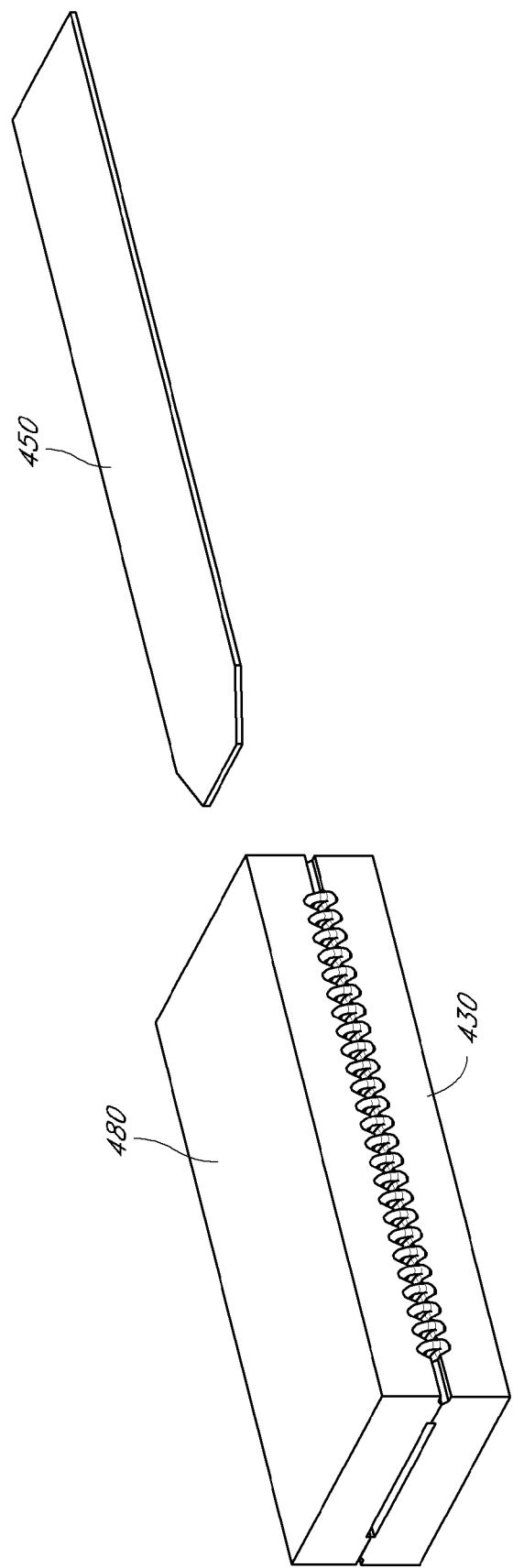
FIG. 21 shows the apparatus of FIG. 19 at a further stage of operation in accordance with one embodiment.
Figure 22:
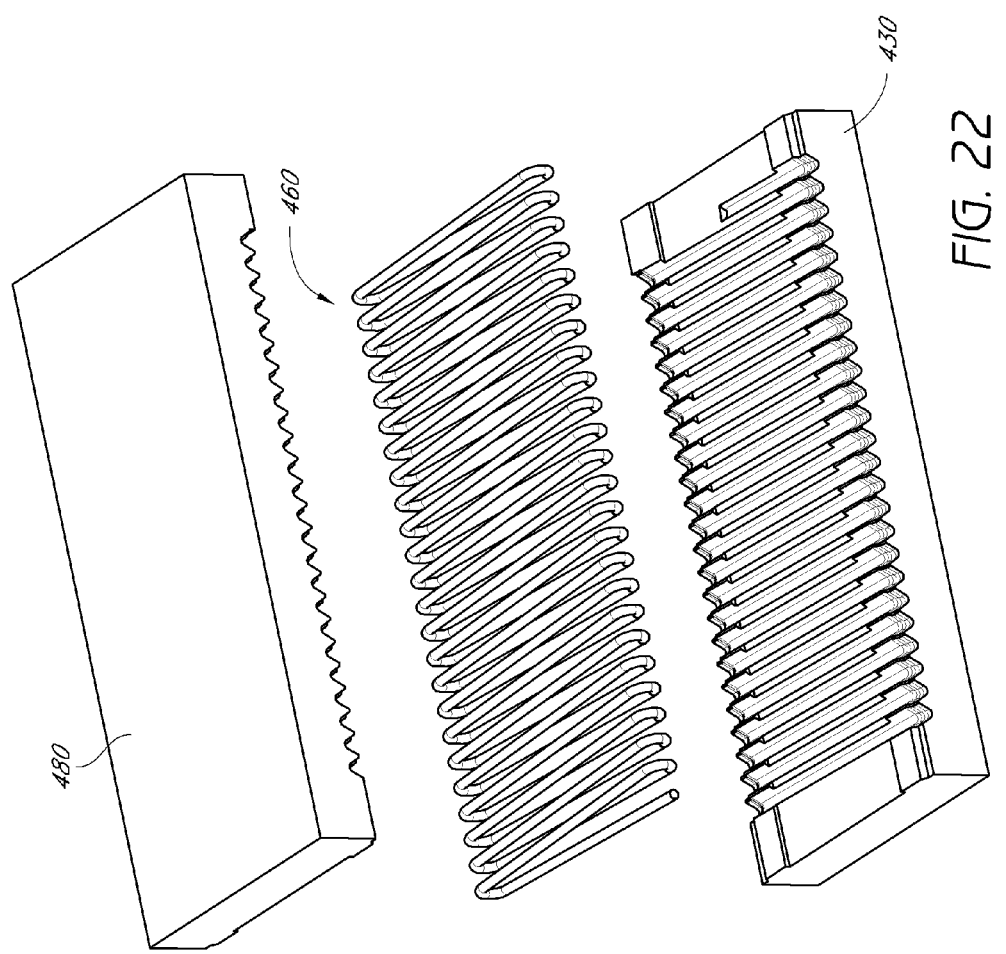
FIG. 22 shows the apparatus of FIG. 19 after a pressing operation.

After the deformation to form the wire fin 460, the center die 450 preferably is removed as illustrated in FIG. 21. The second die 480 is moved away from the first die 430, and the completed wire fin 460 is released from the die. Several such wire fins 460 are manufactured and secured to a heat sink base 52 to form a heat sink 40. In some embodiments an enclosure is placed around the heat sink after the plurality of wire fins have been secured to the heat sink base. The size and dimensions of the heat sink base is determined by the specific requirements of its application.

In the embodiments illustrated herein, the first and second forming dies have been substantially the same, and thus form wire fins that are generally symmetrical. It is to be understood that, in additional embodiments, the dies can be shaped differently so as to form wire fins that are asymmetrical.

Additionally, it is anticipated that presses having structure different than as shown in the exemplary embodiments discussed herein may be constructed and still employ the spirit of the disclosure in this specification. For example, in another embodiment, a press as in the embodiment shown in FIG. 19-22 may employ guide pins that selectively extend through the first, second and third dies so as to maintain proper alignment during compression of the wire member.

Also, the embodiments discussed herein form a wire fin whose height remains generally the same along its length. In additional embodiments, for example, the source wire member may be a conically-shaped coiled wire, and the dies may correspondingly be configured to form a conically-shaped wire fin.

Further, it is to be understood that the length of wire fins made according to the principles described above need not be limited. For example, in another embodiment, a press and source wire member may be configured to create a particularly long wire fin in each pressing operation. After the pressing operation the wire fin is cut into smaller lengths for assembly on a heat sink.

Still further, as discussed above, various configurations of heat sinks can employ principles disclosed herein, and wire forms can be attached to heat sink bases in various ways and configurations. For example, in embodiments illustrated above, all of the loops at the first end of a wire fin are attached to the base. In other embodiments, one or more of the loops may be unattached to the base. Further, another embodiment may include a second base, and a second end of the wire fin may be attached to the second base.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. For example, the embodiments of the dies discussed in connection with FIGS. 7, 13, and 17 can be employed in any of the wire forming presses discussed above. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method of manufacturing a heat sink, comprising:
    providing a first die body having a first wire forming region;
    providing a second die body opposite the first die body and having a second wire forming region;
    providing an elongate third die body;
    providing an elongate coiled wire having a plurality of contiguous loops, and then placing the elongate coiled wire over the third die body;
    positioning the third die body between the first and second die bodies;
    moving the first, second and third die bodies relative one another so as to compress and deform each of the plurality of contiguous loops of the elongate coiled wire simultaneously to form a wire fin comprising a plurality of contiguous loops and having an elongate body shaped to at least partially correspond to a shape defined between the first, second and third die bodies, the wire fin having first and second ends at opposing ends of the elongate body, each of the loops having first and second loop ends corresponding to the respective first and second ends of the wire fin;
    removing the formed wire fin from between the first and second die bodies; and
    attaching the first end of the wire fin to a heat sink base so that the wire fin is in thermal communication with the heat sink base.

2. A method as in claim 1, comprising forming a plurality of wire fins and attaching the first ends of each of the plurality of wire fins to the heat sink base.

3. A method as in claim 2, wherein attaching the first ends of each of the plurality of wire fins to the heat sink base comprises attaching all of the first loop ends of each of the plurality of wire fins to the heat sink base.

4. A method as in claim 2, wherein attaching the first ends of each of the plurality of wire fins to the heat sink base comprises attaching less than all of the first loop ends of each of the plurality of wire fins to the heat sink base.

5. A method as in claim 2, comprising attaching the wire fins to the heat sink base so that loops of each wire fin are staggered relative to loops of an adjacent wire fin.

6. A method as in claim 1 wherein forming the wire fin comprises forming the loops at the first end to a shape that is complementary to the heat sink base.

7. A method as in claim 6, comprising forming a flattened surface on the loops at the first end.

8. A method as in claim 7 additionally comprising providing an end die configured to move relative the first, second and third dies, and forming the flattened surface by compressing the first end with the end die.

9. A method as in claim 6, wherein forming the wire fin comprises forming the loops at the second end to a shape that is complementary to a second heat sink base surface, and attaching loops at the second end to the second heat sink base surface.

10. A method as in claim 1 additionally comprising removing the third die prior to removing the wire fin from between the first and second dies.

11. A method as in claim 10 additionally comprising compressing the wire fin further after removing the third die.

12. A method as in claim 1, wherein the third die body has opposing first and second surfaces, the first surface being generally complementary to a surface of the first die body, the second surface being generally complementary to a surface of the second die body.

13. A method as in claim 12, wherein the first and second surfaces of the third die body are generally symmetrical.

14. A method as in claim 12, wherein the first and second surfaces of the third die body are not symmetrical.

15. A method as in claim 1, wherein the first and second die bodies each comprise a plurality of wire guides configured to accommodate wires, and the elongate coiled wire comprises contiguous wire loops, and additionally comprising aligning the contiguous wire loops with the wire guides prior to compressing the elongate coiled wire.

16. A method as in claim 15 additionally comprising selecting an elongate coiled wire having a pitch between adjacent wire loops that is generally the same as a pitch between adjacent wire guides on the first die body.

17. A method as in claim 1, wherein the first and second dies each have a wire forming face, and additionally comprising deforming the elongate helical wire sufficient so that when the wire fin is formed portions of its elongate loops are longer than the wire forming faces are wide so that the loops at the first end of the wire fin extend outwardly from between the first and second die wire forming faces.

18. A method as in claim 17 additionally comprising applying an end die to form the first end that extends outwardly into a flat shape.

19. A method as in claim 1, wherein a cross-sectional shape of the elongate body after being deformed by the first, second, and third die bodies has a major axis and a minor axis, and the major axis is greater than the minor axis.

20. A method as in claim 2 additionally comprising coupling an enclosure to the heat sink base, the enclosure cooperating with the heat sink base to encircle the plurality of wire fins and define a fluid flow channel through the wire fins.

21. A method as in claim 20, wherein the second loop ends of each of the plurality of wire fins are spaced from the enclosure.

* * * * *